United States Patent
Kurz et al.

(10) Patent No.: US 10,542,644 B2
(45) Date of Patent: Jan. 21, 2020

(54) TWO-PIECE SOLDERABLE SHIELD

(71) Applicant: A.K. Stamping Company, Inc., Mountainside, NJ (US)

(72) Inventors: Arthur Kurz, Vernon, NJ (US); Michael Schneider, Montgomery, NY (US)

(73) Assignee: A.K. Stamping Company, Inc., Mountainside, NJ (US)

( * ) Notice: Subject to any disclaimer, the term of this patent is extended or adjusted under 35 U.S.C. 154(b) by 0 days.

(21) Appl. No.: 15/379,107

(22) Filed: Dec. 14, 2016

(65) Prior Publication Data

US 2018/0168077 A1 Jun. 14, 2018

(51) Int. Cl.
*H05K 9/00* (2006.01)
*H05K 7/20* (2006.01)

(52) U.S. Cl.
CPC ......... *H05K 9/0032* (2013.01); *H05K 7/2039* (2013.01); *H05K 2201/066* (2013.01); *H05K 2201/0707* (2013.01)

(58) Field of Classification Search
CPC . H05K 9/00; H05K 9/0032; H05K 2201/0707
See application file for complete search history.

(56) References Cited

U.S. PATENT DOCUMENTS

| | | | |
|---|---|---|---|
| 3,334,175 A | 8/1967 | Vincent | |
| 5,614,694 A | 3/1997 | Gorenz, Jr. et al. | |
| 5,761,053 A | 6/1998 | King et al. | |
| 5,886,879 A | 3/1999 | Matuschik | |
| 6,178,096 B1 | 1/2001 | Flickinger et al. | |
| 6,178,097 B1 | 1/2001 | Hauk, Jr. | |
| 6,180,876 B1 | 1/2001 | Holmes | |
| 6,219,239 B1 | 4/2001 | Mellberg et al. | |
| 6,269,008 B1 | 7/2001 | Hsu | |
| 6,304,458 B1 | 10/2001 | Mendolia | |
| 6,384,324 B2 | 5/2002 | Flegeo | |
| 6,426,881 B1 | 7/2002 | Kurz | |
| 6,501,016 B1 | 12/2002 | Sosnowski | |
| 6,831,224 B2 | 12/2004 | Koivusilta | |
| 6,870,091 B2 | 3/2005 | Seidler | |
| 6,897,371 B1 | 5/2005 | Kurz et al. | |
| 6,903,262 B2 | 6/2005 | Blersch | |
| 7,006,361 B2 | 2/2006 | Hosokawa et al. | |

(Continued)

OTHER PUBLICATIONS

U.S. Office Action dated Apr. 6, 2016, issued in connection with U.S. Appl. No. 14/735,437 (11 pages).

(Continued)

*Primary Examiner* — Hung V Ngo
(74) *Attorney, Agent, or Firm* — McCarter & English, LLP

(57) ABSTRACT

This disclosure relates to a two-piece shield comprising a fence having integrally formed sidewalls and an upper frame, and a lid. The lid attaches to the fence, which is attached to the circuit board. The fence is a relatively thick, flexible material for supporting the lid. The fence has a recess so that the lid can be recessed into the fence to position the lid closer to the circuit for enhanced heat absorption. The lid could be made of a thicker heat absorbing material than the fence, again to facilitate heat absorption. The lid can be press-fit into the recess of the fence. The fence and lid can have a dovetail configuration to retain the lid in the fence.

18 Claims, 4 Drawing Sheets

(56) References Cited

U.S. PATENT DOCUMENTS

| | | |
|---|---|---|
| 7,104,311 B1 | 9/2006 | Teng |
| 7,113,410 B2 | 9/2006 | Pawlenko et al. |
| 7,119,286 B1 | 10/2006 | Horng |
| 7,165,601 B1 | 1/2007 | Hashimoto |
| 7,208,675 B2 | 4/2007 | Horng |
| 7,488,901 B2 | 2/2009 | Arnold |
| 7,544,885 B2 | 6/2009 | Horng |
| 7,580,270 B2 | 8/2009 | Iikubo et al. |
| 7,724,542 B2 | 5/2010 | Gallahan et al. |
| 7,830,672 B1 | 11/2010 | Kitchen |
| 7,961,479 B2 | 6/2011 | Wang |
| 7,983,058 B2 | 7/2011 | Ishihara |
| 8,237,063 B2 | 8/2012 | Chang |
| 8,383,960 B2 | 2/2013 | Kurz et al. |
| 8,472,170 B2 | 6/2013 | Feng et al. |
| 9,105,899 B2 | 8/2015 | Pakula et al. |
| 9,538,693 B2 | 1/2017 | Kurz et al. |
| 9,603,292 B2 | 3/2017 | Kurz et al. |
| 9,635,789 B2 | 4/2017 | English et al. |
| 9,839,168 B2 * | 12/2017 | Miller ............... H05K 9/003 |
| 2002/0064024 A1 | 5/2002 | McCullough et al. |
| 2002/0101720 A1 | 8/2002 | Kline et al. |
| 2002/0139552 A1 | 10/2002 | Chang |
| 2002/0185294 A1 | 12/2002 | Shlyakhtichman et al. |
| 2003/0151906 A1 | 8/2003 | Schaffer |
| 2003/0223212 A1 | 12/2003 | Hosokawa et al. |
| 2004/0052064 A1 | 3/2004 | Oliver et al. |
| 2004/0190260 A1 | 9/2004 | Sasaki |
| 2005/0116145 A1 | 6/2005 | Aki et al. |
| 2005/0121212 A1 | 6/2005 | English et al. |
| 2006/0002099 A1 | 1/2006 | Stoneham et al. |
| 2006/0272857 A1 | 12/2006 | Arnold |
| 2007/0210082 A1 | 9/2007 | English et al. |
| 2007/0211436 A1 | 9/2007 | Robinson et al. |
| 2008/0101028 A1 | 5/2008 | Sung |
| 2008/0158849 A1 | 7/2008 | Gallahan et al. |
| 2008/0179086 A1 | 7/2008 | English et al. |
| 2009/0139692 A1 | 6/2009 | Lin |
| 2009/0283246 A1 | 11/2009 | Chen |
| 2009/0321049 A1 | 12/2009 | Chen |
| 2010/0157544 A1 | 6/2010 | Tsao et al. |
| 2010/0236755 A1 | 9/2010 | Li et al. |
| 2011/0026194 A1 | 2/2011 | Riggsby et al. |
| 2011/0162879 A1 | 7/2011 | Bunyan et al. |
| 2011/0176279 A1 | 7/2011 | Zhao et al. |
| 2011/0214916 A1 | 9/2011 | Chang |
| 2011/0266045 A1 | 11/2011 | Xiong et al. |
| 2011/0310562 A1 | 12/2011 | Strader et al. |
| 2012/0000625 A1 | 1/2012 | Tan |
| 2012/0015127 A1 | 1/2012 | Kurz et al. |
| 2012/0298414 A1 | 11/2012 | Park |
| 2013/0048369 A1 | 2/2013 | Malek et al. |
| 2013/0120957 A1 * | 5/2013 | Werner ............... H05K 9/0032 361/818 |
| 2013/0235528 A1 | 9/2013 | Lee et al. |
| 2013/0250540 A1 | 9/2013 | Hou |
| 2013/0279132 A1 * | 10/2013 | Lo ............... H05K 9/0032 361/757 |
| 2014/0071635 A1 | 3/2014 | Werner et al. |
| 2014/0078677 A1 | 3/2014 | Dolci et al. |
| 2014/0307392 A1 | 10/2014 | Kurz et al. |
| 2015/0201533 A1 | 7/2015 | Daughtry, Jr. et al. |
| 2015/0282393 A1 | 10/2015 | Kurz et al. |
| 2016/0100511 A1 | 4/2016 | Kurz et al. |
| 2016/0113161 A1 * | 4/2016 | Ball ............... H05K 9/0032 174/381 |
| 2017/0105322 A1 | 4/2017 | Kurz et al. |
| 2017/0172019 A1 | 6/2017 | Kurz et al. |
| 2017/0231122 A1 | 8/2017 | Kurz et al. |
| 2017/0290209 A1 * | 10/2017 | Craig ............... H05K 1/021 |
| 2018/0184551 A1 | 6/2018 | Kurz et al. |

OTHER PUBLICATIONS

U.S. Office Action dated Dec. 31, 2015, issued in connection with U.S. Appl. No. 14/210,561.

U.S. Office Action dated Nov. 1, 2016, issued in connection with U.S. Appl. No. 14/210,561 (14 pages).

U.S. Office Action dated Apr. 7, 2016, issued in connection with U.S. Appl. No. 14/210,561 (19 pages).

Notice of Allowance for U.S. Appl. No. 14/210,561 dated Nov. 16, 2016.

International Search Report of the International Searching Authority dated Feb. 24, 2017, issued in connection with International Application No. PCTIUS2016/66570 (3 pages).

Written Opinion of the International Searching Authority dated Feb. 24, 2017, issued in connection with International Application No. PCT/US2016/66570 (7 pages).

U.S. Office Action dated Jun. 26, 2017, issued in connection with U.S. Appl. No. 15/378,638 (7 pages).

U.S. Office Action dated Nov. 1, 2016, issued in connection with U.S. Appl. No. 14/735,437 (11 pages).

Notice of Allowance for U.S. Appl. No. 14/735,437 dated Jan. 23, 2017.

Laird Technologies, Board Level Shields and Contacts, 2004, pp. 1-28.

Petition for Inter Partes Review of U.S. Pat. No. 9,538,693, Aluminum EMI/RF Shield, filed Aug. 31, 2017, 73 pages.

Exhibit 1001 of Inter Partes Review: U.S. Pat. No. 9,538,693 (9 pages).

Exhibit 1002 of Inter Partes Review: U.S. Appl. No. 14/210,561 File History ("the '561 Application") (409 pages).

Exhibit 1003 of Inter Partes Review: '561 Application Claims (17 pages).

Exhibit 1004 of Inter Partes Review: Dec. 31, 2015 Office Action rejecting 20 Claims (7 pages).

Exhibit 1005 of Inter Partes Review: Feb. 18, 2016 Examiner Interview Summary (4 pages).

Exhibit 1006 of Inter Partes Review: Mar. 9, 2016 Response to Office Action (12 pages).

Exhibit 1007 of Inter Partes Review: Apr. 7, 2106 Final Rejection Office Action (18 pages).

Exhibit 1008 of Inter Partes Review: U.S. Patent Publication No. 2007/0210082 ("English") (61 pages).

Exhibit 1009 of Inter Partes Review: Oct. 7, 2016 Response to Final Office Action (25 pages).

Exhibit 1010 of Inter Partes Review: Affidavit of inventor, Arthur Kurz filed with Response to Final Office Action (5 pages).

Exhibit 1011 of Inter Partes Review: Notice of Allowance, (11 pages).

Exhibit 1012 of Inter Partes Review: U.S. Patent Publication 2013/0033843 ("Crotty") (20 pages).

Exhibit 1013 of Inter Partes Review: CE Engineering, English Jul.-Aug. 2002 article (7 pages).

Exhibit 1014 of Inter Partes Review: Laird White Paper (14 pages).

Exhibit 1015 of Inter Partes Review: EDA Blog Website Referencing quotes from Laird White Paper, (1 page).

Exhibit 1016 of Inter Partes Review: Declaration of Christopher Butler, Office Manager of Internet Archive (13 pages).

Exhibit 1017 of Inter Partes Review: U.S. Pat. No. 5,371,404 ("Juskey") (11 pages).

Exhibit 1018 of Inter Partes Review: U.S. Pat. No. 7,589,968 ("Oliver") (6 pages).

Exhibit 1019 of Inter Partes Review: The MAJR Shield Data Sheets Website http://www.majr.com/wp-content/uploads/20 13/06/DS-7-2-1-SAL-53- 5-3-10- MAJR-Shield .pdf (2 pages).

Exhibit 1020 of Inter Partes Review: MAJR Data Sheets Website (2 pages).

Exhibit 1021 of Inter Partes Review: MAJR Shield Website (1 page).

(56) References Cited

OTHER PUBLICATIONS

Exhibit 1022 of Inter Partes Review: MAJR Design Features Website (2 pages).
Exhibit 1023 of Inter Partes Review: Paperback Oxford English Dictionary, 2012 "friction" (3 pages).
Exhibit 1024 of Inter Partes Review: Declaration of Deborah Duen Ling Chung (92 pages).
Exhibit 1024 Part 1 of Inter Partes Review: Appendices A-J (198 pages).
Exhibit 1024 Part 2 of Inter Partes Review: Appendices K-S (164 pages).
Exhibit 1024 Part 3 of Inter Partes Review: Appendices T-Z (176 pages).
Exhibit 1024 Part 4 of Inter Partes Review: Appendices AA-KK (470 pages).
Exhibit 1024 Part 5 of Inter Partes Review: Appendices LL-QQ (100 pages).
Exhibit 1025 of Inter Partes Review: Deborah Duen Ling Chung Curriculum Vitae (39 pages).
Exhibit 1026 of Inter Partes Review: CRC Press Handbook of Chemistry and Physics 85th Edition (2004-2005) (4 pages).
Exhibit 1027 of Inter Partes Review: Microelectronics Packaging Handbook (Graftech Exhibit 2014) (34 pages).
Exhibit 1028 of Inter Partes Review: Nippon Light Metal—Anything for Aluminum, Nippon Light Metal Company, Ltd. https://web.archive.org/web/20130127202210/http://www.nikkeikin.com/products/board/p 12.html (3 pages).
Exhibit 1029 of Inter Partes Review: Global EMI/RFI Shielding Materials and Technologies Market 2015-2021 htlp//www.prnewswire.com/news-releases/global-emirfi-shieldingmaterials- and-technologies-market-2015-2021-market-growth-from-56-billion-in-2015-to-78-billion-in-2021—research'-and-markets-300407049.html (14 pages).
Petition for Inter Partes Review of U.S. Pat. No. 9,538,693, Case No. IPR2018-01163, filed May 25, 2018 (75 pages).
Exhibit 1001 of Inter Partes Review Case No. IPR2018-01163: U.S. Pat. No. 9,538,693 ("Kurz") (9 pages).
Exhibit 1002 of Inter Partes Review Case No. IPR2018-01163: File History of U.S. Appl. No. 14/210,561 ("the 561 Application") (409 pages).
Exhibit 1003 of Inter Partes Review Case No. IPR2018-01163: U.S. Appl. No. 14/210,561 and Claims (17 pages).
Exhibit 1004 of Inter Partes Review Case No. IPR2018-01163: Office Action dated Dec. 31, 2015, in U.S. Appl. No. 14/210,561 (7 pages).
Exhibit 1005 of Inter Partes Review Case No. IRP2018-01163: Examiner Interview Summary dated Feb. 18, 2016, in U.S. Appl. No. 14/210,561 (4 pages).
Exhibit 1006 of Inter Partes Review Case No. IPR2018-01163: Response to Office Action filed Mar. 9, 2016, in U.S. Appl. No. 14/210,561 (12 pages).
Exhibit 1007 of Inter Partes Review Case No. IPR2018-01163: Final Office Action dated Apr. 7, 2106, in U.S. Appl. No. 14/210,561 (18 pages).
Exhibit 1008 of Inter Partes Review Case No. IPR2018-01163: U.S. Patent Publication No. 2007/0210082 ("English") (61 pages).
Exhibit 1009 of Inter Partes Review Case No. IPR2018-01163: Response to Final Office Action filed Oct. 7, 2016, in U.S. Appl. No. 14/210,561 (25 pages).
Exhibit 1010 of Inter Partes Review Case No. IPR2018-01163: Affidavit of inventor, Arthur Kurz, filed with Response to Final Office Action in U.S. Appl. No. 14/210,561 (5 pages).
Exhibit 1011 of Inter Partes Review Case No. IPR2018-01163: Notice of Allowance in U.S. Appl. No. 14/210,561 (11 pages).
Exhibit 1012 of Inter Partes Review Case No. IPR2018-01163: U.S. Patent Publication No. 2013/0033843 ("Crotty") (20 pages).
Exhibit 1013 of Inter Partes Review Case No. IPR2018-01163: Declaration of Susan E. Beck (8 pages).

Exhibit 1014 of Inter Partes Review Case No. IPR2018-01163: "Advanced Materials and Design for Electromagnetic Interference Shielding" Chapters 1-5, by Xingcun Colin Tong ("Tong") (169 pages).
Exhibit 1014 of Inter Partes Review Case No. IPR2018-01163: "Advanced Materials and Design for Electromagnetic Interference Shielding" Chapters 6-12, by Xingcun Colin Tong ("Tong") (162 pages).
Exhibit 1015 of Inter Partes Review Case No. IPR2018-01163: Printout of the webpage <www.akstamping.com/products-1/> on May 3, 2018 (6 pages).
Exhibit 1016 of Inter Partes Review Case No. IPR2018-01163: Declaration of Paul Crotty (2 pages).
Exhibit 1017 of Inter Partes Review Case No. IPR2018-01163: U.S. Pat. No. 5,371,404 ("Juskey") (11 pages).
Exhibit 1018 of Inter Partes Review Case No. IPR2018-01163: U.S. Pat. No. 7,589,968 ("Oliver") (6 pages).
Exhibit 1019 of Inter Partes Review Case No. IPR2018-01163: Patent Owner Preliminary Response (Paper 5) in PR2017-02038 (67 pages).
Exhibit 1020 of Inter Partes Review Case No. IPR2018-01163: Thermal Conductivity Tables from CRC Press—Handbook of Chemistry and Physics 85th Edition (2004-2005) (4 pages).
Exhibit 1021 of Inter Partes Review Case No. IPR2018-01163: MAJR Shield Website as of Jul. 8, 2010, printout of the archived webpage <http://www.majr.com/majr_shield.htm> (1 page).
Exhibit 1022 of Inter Partes Review Case No. IPR2018-01163: "Thermal Design Considerations" and "Heat Transfer in Electronic Packages" from Microelectronics Packaging Handboook 1989 Edition (Exhibit 2014 in IPR2017-02038) (34 pages).
Exhibit 1023 of Inter Partes Review Case No. IPR2018-01163: Definition of "friction" in Paperback Oxford English Dictionary 2012 Edition (3 pages).
Exhibit 1024 of Inter Partes Review Case No. IPR2018-01163: Declaration of Deborah D. L. Chung, Ph.D. (102 pages).
Exhibit 1024—Part 1 of Inter Partes Review Case No. IPR2018-01163: Appendices A-J to the D.D.L. Chung Declaration (207 pages).
Exhibit 1024—Part 2 of Inter Partes Review Case No. IPR2018-01163: Appendices K-S to the D.D.L. Chung Declaration (164 pages).
Exhibit 1024—Part 3 of Inter Partes Review Case No. IPR2018-01163: Appendices T-Z to the D.D.L. Chung Declaration (111 pages).
Exhibit 1024—Part 4 of Inter Partes Review Case No. IPR2018-01163: Appendices AA-FF to the D.D.L. Chung Declaration (204 pages).
Exhibit 1024—Part 5 of Inter Partes Review Case No. IPR2018-01163: Appendices GG-KK to the D.D.L. Chung Declaration (216 pages).
Exhibit 1024—Part 6 of Inter Partes Review Case No. IPR2018-01163: Appendices LL-MM to the D.D.L. Chung Declaration (40 pages).
Exhibit 1024—Part 7 of Inter Partes Review Case No. IPR2018-01163: Appendices NN-QQ to the D.D.L. Chung Declaration (59 pages).
Exhibit 1025 of Inter Partes Review Case No. IPR2018-01163: Curriculum Vitae of Deborah D. L. Chung, Ph.D. (48 pages).
Exhibit 1026 of Inter Partes Review Case No. IPR2018-01163: Declaration of Victor M. Bright, Ph.D. (Exhibit 2001 in IPR2017-02038)(85 pages).
Office Action dated Apr. 3, 2018, issued in connection with U.S. Appl. No. 15/903,421 (8 pages).
Notice of Allowance dated Apr. 11, 2017, issued in connection with U.S. Appl. No. 15/378,638 (9 pages).
Notice of Allowance dated Nov. 9, 2017, issued in connection with U.S. Appl. No. 15/378,638 (8 pages).
Laird Technologies, Aluminum Cover Board Level Shield 2015 (1 page).

* cited by examiner

TWO-PIECE SOLDERABLE SHIELD

BACKGROUND OF THE DISCLOSURE

Field of the Disclosure

The disclosure relates generally to shielding elements, and more particularly to a two-piece solderable shield for circuitry on a circuit board.

Related Art

Shielding elements are used in electrical circuits to protect specific components of the circuit from electromagnetic radiation (e.g., spurious emission or irradiation). In particular, screening or shielding elements are used to comply with EMC (electromagnetic compatibility) standards.

SUMMARY OF THE INVENTION

A two-piece solderable shield is disclosed. The shield includes a fence and a lid, the fence having sidewalls and an upper frame. The sidewalls and upper frame could be integrally formed and are configured to surround the circuit when mounted to the circuit board. The upper frame includes a recess for receiving the lid therein. The shield could be formed from aluminum or an aluminum-based alloy that is plated with a solderable material such as nickel or tin. The frame could be soldered to the circuit board, the electrical components can be checked, and the lid can be placed on and soldered to the fence. The lid and the fence can be formed by stamping. The lid could be made of a different material and/or be of a greater thickness than the fence to facilitate shielding and heat absorption. With such an assembly, the lid can be positioned over (and proximate to) the circuit to shield the circuit (e.g., from electromagnetic radiation) and dissipate heat from the circuit.

BRIEF DESCRIPTION OF THE DRAWINGS

The foregoing features will be apparent from the following Detailed Description, taken in connection with the accompanying drawing(s), in which.

DETAILED DESCRIPTION OF THE INVENTION

Disclosed herein is a two-piece solderable shield. The two-piece shield provides shielding at a reduced weight by using a fence and/or lid formed from aluminum or an aluminum-based alloy plated with a solderable material (e.g., nickel, tin, etc.). The fence and/or lid could also include materials such as nickel silver, cold-rolled steel, plated steel, copper, or any combination thereof. By providing a recess in the fence for receiving the lid, the stacked height (e.g., the z-axis relative to the plane of the circuit board on which the two-piece shield is mounted) of the two-piece shield can be reduced. For example, the height added to a conventional shield by placing a lid on top of a fence (e.g., 0.15 to 0.20 mm) can be eliminated by the two-piece solderable shield of the present disclosure. Increased structural rigidity of the fence provides for the use of thinner materials for the fence and/or thicker materials for the lid, based on the requirements of individual shielding applications.

Figure 1:
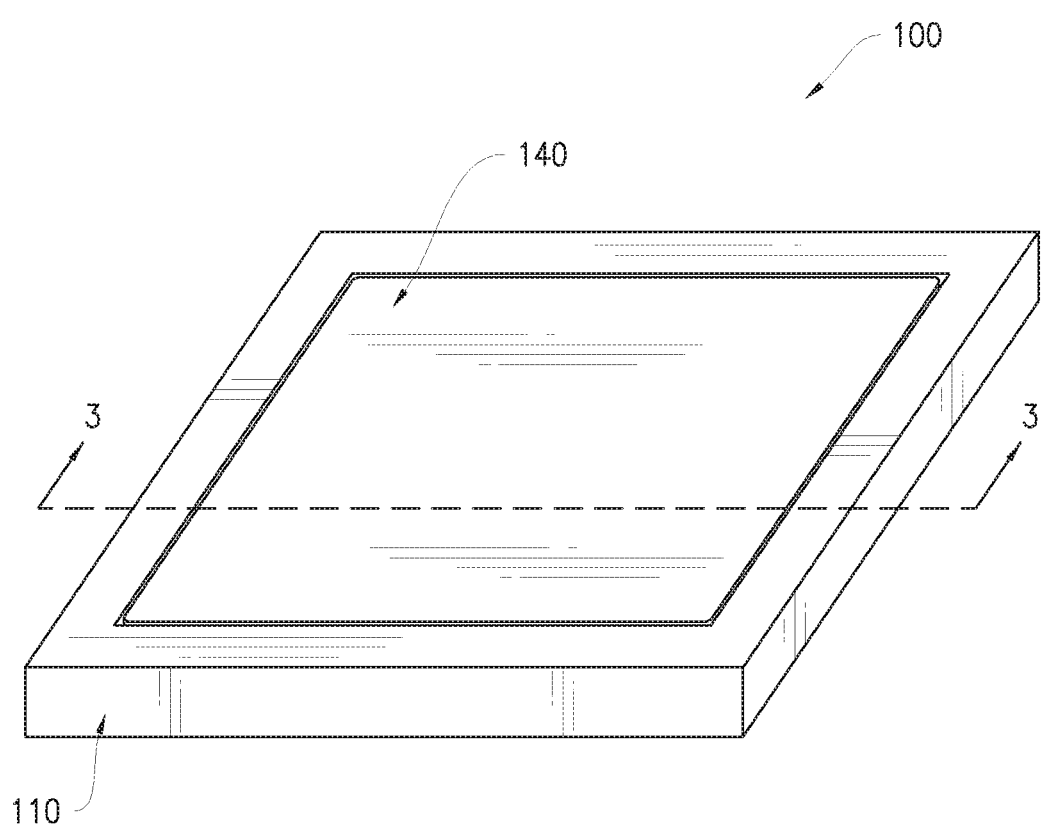
FIG. 1 is a perspective view of an assembled two-piece solderable shield according to the present disclosure.
Figure 2:
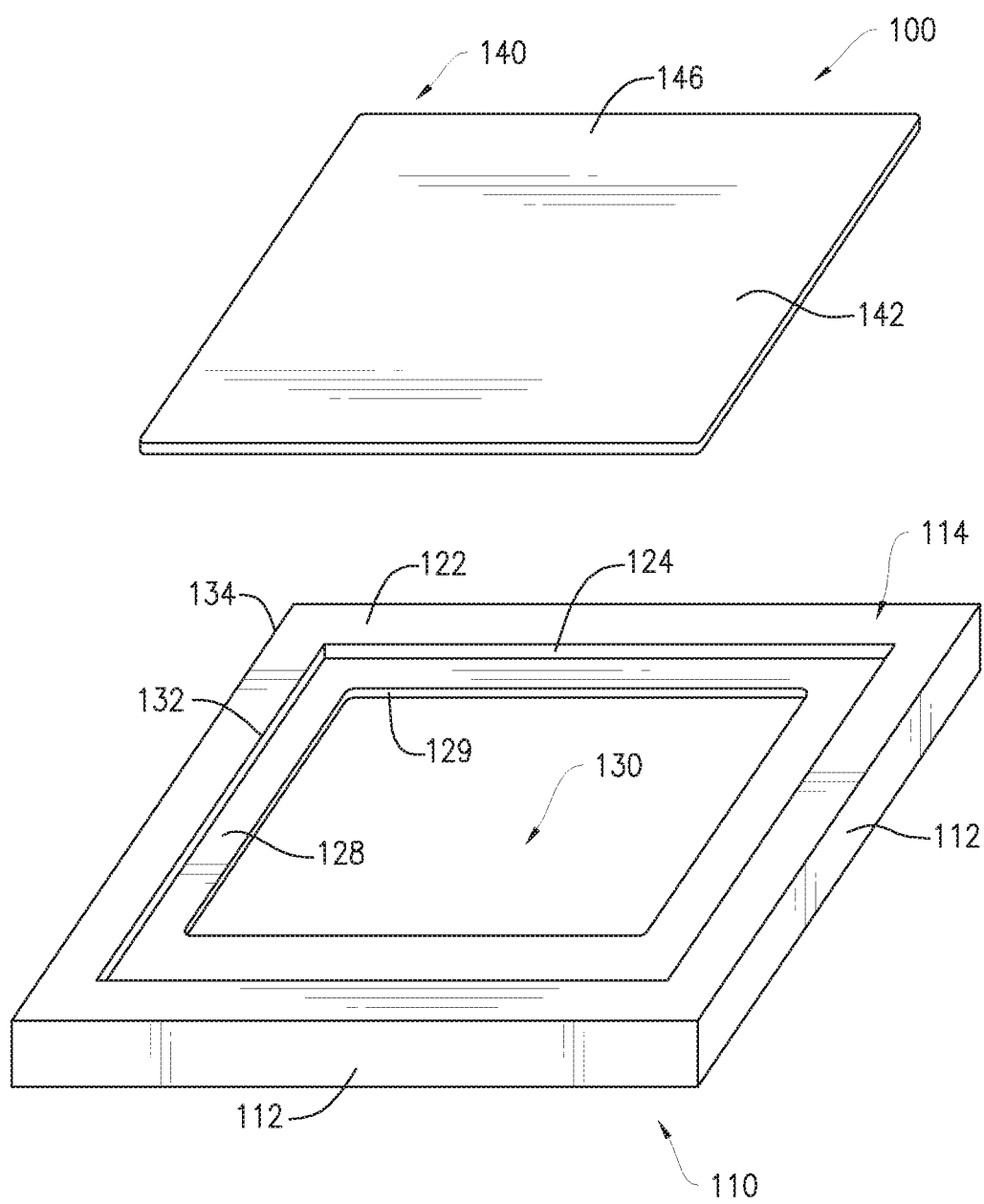
FIG. 2 is an exploded view of the two-piece solderable shield of FIG. 1.
Figure 3:
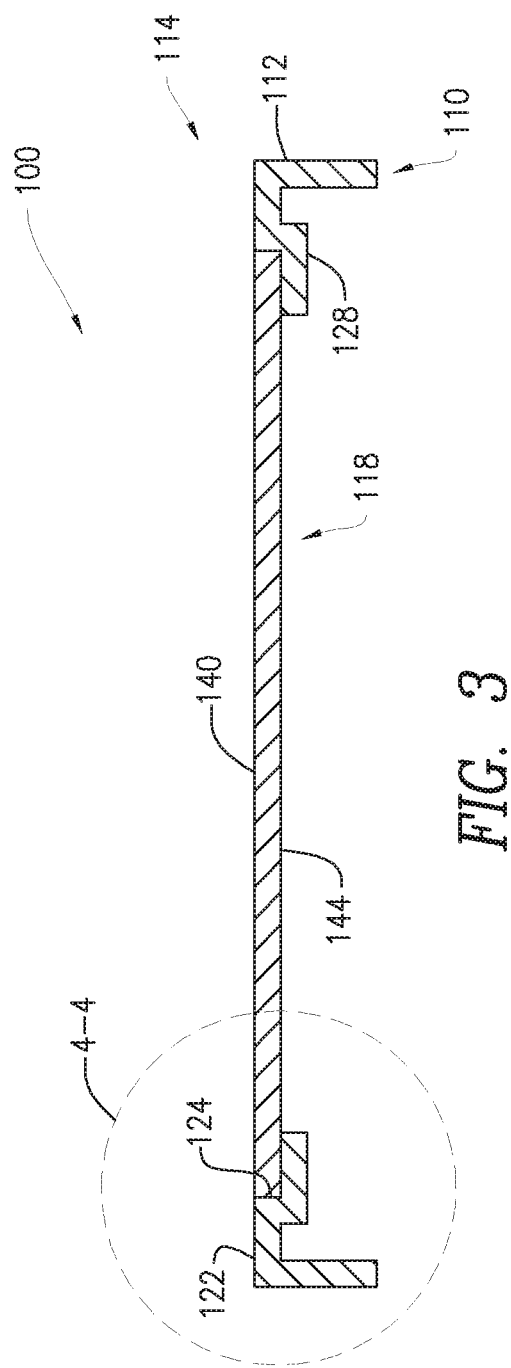
FIG. 3 is a cross-sectional view of the two-piece solderable shield of FIG. 1 taken along the line 3-3.
Figure 4:
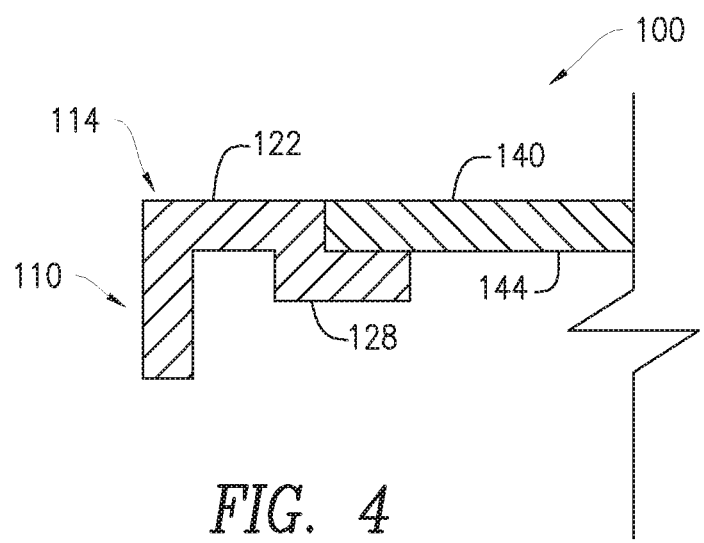
FIG. 4 is an enlarged partial cross-sectional view of the two-piece solderable shield of FIG. 1 indicated by line 4-4.

FIGS. 1-4 are views of the two-piece shield, indicated generally at 100, according to the present disclosure. More specifically, FIG. 1 is a perspective view of an assemble two-piece shield having a fence, indicated generally at 110, and a lid, indicated generally at 140. FIG. 2 is an exploded view of the two-piece shield 100 of FIG. 1. FIG. 3 is a cross-sectional view of the two-piece shield of FIG. 1 taken along the line 3-3, and FIG. 4 is an enlarged partial cross-sectional view of the two-piece solderable shield of FIG. 1 indicated by line 4-4.

As shown in FIG. 2, the fence 110 is configured to be attached to a circuit board (not shown) about at least a portion of a circuit (e.g., circuit elements, electrical components, etc.). The fence 110 has sidewalls 112 and an upper frame, indicated generally at 114. The height and/or thickness of the sidewalls 112 of the fence 110 may be any size depending on the performance requirements and/or heat dissipation requirements of the electrical components to be shielded. The sidewalls 112 and upper frame of fence 110 could form an enclosure defining an interior 118 (see, for example, FIG. 3) to surround the electrical components. The shape of the fence 110 depends on the shape of the electrical components to be shielded and their location on the circuit board. Accordingly, the fence 110 could be of any size and shape depending on the size, shape, and/or positioning of the electrical elements requiring shielding and/or heat dissipation. The fence 110 could be formed by stamping, milling, and/or bending.

The upper frame 114 has a top wall 122, an interior wall 124 at least partially defining a recess 126 (see, for example, FIG. 3), and a shelf 128 having an inner edge 129 and defining an aperture 130. The size and shape of an interior perimeter 132 of the top wall 122 of upper frame 114 could be independent of and could be different from the size and shape of an exterior perimeter 134 of the top wall 122 of upper frame 114 and/or sidewalls 112. The interior perimeter 132 of the top wall 122 could vary in size and/or shape from the exterior perimeter 134 of the top wall 122 depending on performance requirements, the circuit layout, and/or manufacturing purposes. For example, an area of a circuit may be enclosed by the fence 110, but not require heat dissipation and/or shielding (e.g., by the lid). Asymmetry between the interior perimeter 132 and exterior perimeter 134 of the top wall 122 could define an engagement surface (not shown) for providing an enlarged top wall surface for an assembly robot to engage the frame 110 for automated assembly of the two-piece shield 100 (e.g., to move, position, and/or assemble the frame 110 and lid 140 while minimizing the risk of accidental deformation of the components).

As shown in FIG. 2, the interior wall 124 extends downwardly from the interior perimeter 132 of the top wall 122 (e.g., extending perpendicularly from the top wall 122). The shelf 128 extends inwardly (e.g., towards a center of the fence 110) from a bottom of the interior wall 124 (e.g., extending perpendicularly from the interior wall 124). The shelf 128 could be parallel to, and offset from, the top wall 122, and the top wall 122 and shelf 128 could be perpendicular to the interior wall 124. Accordingly, the top surface of the shelf 128 and an inner surface of the interior wall 124 form a recess 126. The interior wall 124 could be of any length or depth to facilitate the insertion of a lid 140 of various thicknesses, discussed hereinbelow. The inner edge 129 of the shelf 128 forms an aperture 130 therethrough. Accordingly, the recess 126 is positioned above the aperture 130 (and/or top surface of the shelf 128) but below the top wall 122 (e.g., between a top surface of shelf 128 and top wall 122).

In accordance with some aspects of the present disclosure, the sidewalls 112 and the upper frame 114 of the fence 110 could be integrally formed. The fence 110 could be manufactured from a single sheet of metal by way of metal forming processes such as stamping (e.g., punching), pressing, bending and/or other suitable processes for integrally forming metal components. In one example, the fence 110 could be stamped, forming the aperture 130 and depending sidewalls 112, pressed to form the shelf 128 and recess 126, and the depending sidewalls 112 could be bent to their final position, thereby forming the final shape/configuration of the fence 110. According to some aspects of the present disclosure, the fence 110 could be made out of aluminum or an aluminum-based alloy that is coated (e.g., pre or post-plated) with a solderable material (e.g., nickel, tin, etc.) to facilitate soldering operations, discussed hereinbelow. According to further aspects of the present disclosure, the fence 110 could also include or be formed of materials such as nickel silver, cold-rolled steel, plated steel, copper, or any combination thereof.

In addition to providing a recess for receiving the lid 140, the interior wall 124 and the shelf 128 provide for increased structural rigidity of the upper frame 114. Due to the increased rigidity of the upper frame 114, the fence 110 is able to support a heavier and/or thicker lid than would otherwise be possible. For example, the fence 110 could be formed from materials having the same thickness as the lid 140, or the fence could be formed from a different and/or thinner material than the lid 140 due to the increased structural rigidity provided by the upper frame 114 of the fence 110.

The lid 140 has a top surface 142, a bottom surface 144 opposite the top surface 142, and a perimeter 146. The perimeter 146 of lid 140 corresponds in size and shape to the interior wall 124 of the upper frame 114. The lid 140 could be made of any of a variety of materials depending on manufacturing and/or performance requirements. For example, the lid 140 could be made out of aluminum (e.g., for a normal circuit) or a material having a greater heat absorption characteristic (e.g., copper). According to some aspects of the present disclosure, the lid 140 could be made out of aluminum or an aluminum-based alloy that is coated (e.g., pre or post-plated) with a solderable material (e.g., nickel, tin, etc.) to facilitate soldering operations, discussed hereinbelow. According to further aspects of the present disclosure, the lid 140 could also include or be formed of materials such as nickel silver, cold-rolled steel, plated steel, copper, or any combination thereof. The lid 140 can be of any variety of shapes depending on manufacturing and/or performance requirements and/or the portion of the circuit board (e.g., the particular electronic components) requiring shielding and/or heat absorption. The lid 140 could be formed from similar materials (e.g., aluminum plated with a solderable material) having the same thickness as the lid 140, or the lid 140 could formed from a different and/or thicker material than the fence 110 due to the increased structural rigidity provided by the upper frame 114 of the fence 110. The lid 140 could be formed by stamping or any other suitable metal forming process.

As shown in FIGS. 3-4, the lid 140 is positioned in the recess 126 of the fence 110, such that the bottom surface 144 of the lid 140 contacts the top surface of the shelf 128 of the upper frame 114 and/or the perimeter 146 of the lid 140 contacts the interior wall 124 of the upper frame 114. According to some aspects of the present disclosure, the lid 140 could be press fit and/or interference fit into the upper frame 114, and/or the bottom surface 144 of the lid 140 could rest on the shelf 128 of the upper frame 114. When the lid 140 is positioned into the recess 126 of the fence 110, the lid 140 could be flush or offset from (e.g., above or below) the top wall 122 of the upper frame 114. When the assembled two-piece shield 100 is positioned over a circuit of a circuit board, the lid 140 (and upper frame 114) is positioned over and/or proximate to the electrical components providing electromagnetic shielding and facilitating heat dissipation of electrical components of the circuit. The lid 140 can be recessed from the top wall 122 to be positioned closer to the circuitry being shielded. When assembled and positioned over the circuit, the lid 140 is directly exposed to the circuit (and circuit elements) through the aperture 130 of the shelf 128 of the fence 110, which provides improved shielding and/or heat dissipation with decreased weight (e.g., due to the aperture 130 of the lid 140).

Figure 5:
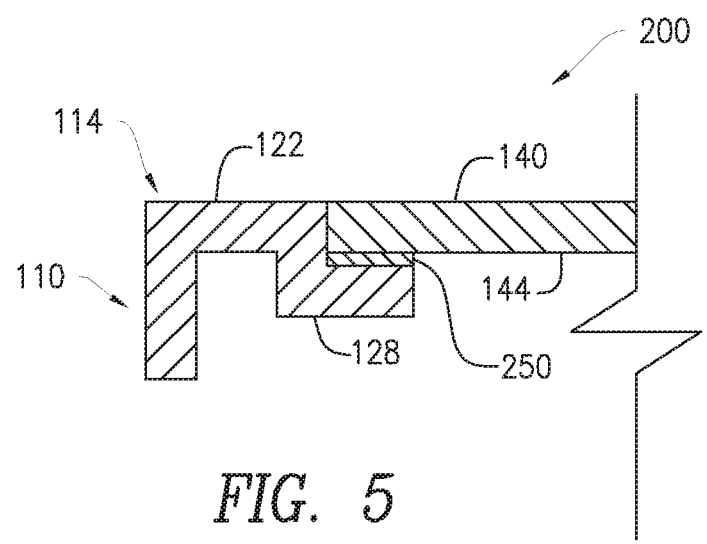
FIG. 5 is an enlarged partial cross-sectional view illustrating another aspect of the two-piece solderable shield according to the present disclosure.

FIG. 5 shows an enlarged partial cross-sectional view illustrating another aspect of an exemplary two-piece solderable shield 200 according to the present disclosure. The two-piece solderable shield 200 can be substantially similar in structure and function to the two-piece solderable shield 100, except for the distinctions noted herein. Therefore, like reference numbers represent like structures.

As shown in FIG. 5, the two-piece shield 200 includes lid 140 positioned in recess 126 of the fence 110. According to one aspect of the exemplary two-piece shield 200, solder paste 250 could be disposed between the lid 140 and the shelf 128 of the upper frame 114. The lid 140 could be press-fit (e.g., interference-fit) and/or soldered into the recess 126 of the upper frame 114. According to further aspects of the present disclosure, the lid 140 could be coupled (e.g., electrically) to the upper frame 114 of the fence 110 by way of the soldering paste 250, discussed in further detail hereinbelow. When the two-piece shield 200 is assembled into its final configuration (e.g., lid 140 being positioned in the recess 126 of the fence 110), the top surface of the lid 140 could be flush or offset from (e.g., above or below) the top surface of top wall 122 of the upper frame 114.

As shown in FIG. 5, and discussed hereinabove in connection with FIGS. 1-4, the interior wall 124 extends downwardly from the top wall 122 (e.g., extending perpendicularly from the top wall 122) and shelf 128 extends inwardly (e.g., towards a center of the fence 110) from the bottom of the interior wall 124 (e.g., extending perpendicularly from the interior wall 124). The interior wall 124 could be of any length or depth to facilitate both the insertion of a lid 140, as well as solder paste 250. For example, in order to minimize the height of the two-piece shield 200, the depth of interior wall 124 could be greater than the thickness of the lid 140 by an amount equal to the thickness of the solder paste 250 (e.g., 25 microns), thereby compensating for the thickness of the solder paste 250 and maintaining coplanarity between the top of the lid 140 and the top wall 122 of the fence 110.

According to some aspects of the present disclosure, the fence 110 is soldered to a circuit board in a first soldering operation (e.g., reflow or other suitable process). After the fence 110 is soldered to the circuit board, the circuitry can be tested, tuned and reworked if necessary. For example, malfunctioning components could be replaced. Solder paste 250 could be dispensed on the shelf 128 prior to, or after, the fence 110 is soldered to the circuit board. The lid 140 could then be positioned in the recess 126 of the upper frame 114 by way of a friction/interference fit and/or a second soldering operation (e.g., reflow or other suitable process), thereby coupling (e.g., mechanically and/or electrically) the lid 140 to the fence 110.

The present disclosure may be embodied in other specific forms without departing from the spirit or essential attributes of the disclosure.

Having thus described the disclosure in detail, it is to be understood that the foregoing description is not intended to limit the spirit or scope thereof. It will be understood that the embodiments of the present disclosure described herein are merely exemplary and that a person skilled in the art may make any variations and modification without departing from the spirit and scope of the disclosure. All such variations and modifications, including those discussed above, are intended to be included within the scope of the disclosure.

What is claimed is:

1. A two-piece electromagnetic radiation and heat dissipation shield for electrical components, comprising:
    a fence formed of aluminum plated with a solderable material, the fence having sidewalls and an upper frame forming an enclosure surrounding electrical components, the upper frame having a top wall, an interior wall depending from the top wall and defining a recess, and a shelf extending from the interior wall and offset from the top wall, the shelf having a continuous top surface and an inner edge defining an aperture;
    a lid formed of aluminum plated with a solderable material, the lid sized and shaped to be received within the recess and on the shelf; and
    the lid soldered to the continuous top surface of the shelf of the fence.

2. The two-piece shield of claim 1, wherein the solderable material is nickel or tin.

3. The two-piece shield of claim 1, wherein the fence is soldered to a circuit board.

4. The two-piece shield of claim 1, wherein the sidewalls and the upper frame are integrally formed.

5. The two-piece shield of claim 1, wherein the shelf extends parallel to the top wall of the lid.

6. The two-piece shield of claim 1, wherein a bottom surface of the lid contacts a top surface of the shelf of the upper frame.

7. The two-piece shield of claim 1, wherein the lid is press-fit into the upper frame.

8. The multi-piece shield of claim 7, wherein the lid has an outer edge that frictionally engages the interior wall of the lid.

9. The two-piece shield of claim 1, further comprising solder paste disposed on a top surface of the shelf of the upper frame.

10. The two-piece shield of claim 1, wherein the lid is directly exposed to the electrical components through the aperture of the upper frame of the fence.

11. The two-piece shield of claim 1, wherein a top surface of the lid is coplanar with a top surface of the top wall of the upper frame of the fence.

12. A two-piece electromagnetic radiation and heat dissipation shield for electrical components, comprising:
    a fence having sidewalls and an upper frame forming an enclosure surrounding electrical components, the upper frame having a top wall, an interior wall depending from the top wall and defining a recess, and a shelf extending from the interior wall and offset from the top wall, the shelf having a continuous top surface and an inner edge defining an aperture;
    a lid sized and shaped to be received within the recess and on the shelf; and
    the lid soldered to the continuous top surface of the shelf of the fence.

13. The two-piece shield of claim 12, wherein the fence and the lid are formed from an aluminum-based alloy.

14. The two-piece shield of claim 12, wherein the fence and the lid are plated with a solderable material.

15. The two-piece shield of claim 14, wherein the plated material is nickel or tin.

16. The two-piece shield of claim 12, wherein the fence is formed from a first material and the lid is formed from a second material.

17. The two-piece shield of claim 16, wherein the first material is selected from the group consisting of nickel silver, cold-rolled steel, plated steel, and copper.

18. The two-piece shield of claim 17, wherein the second material is selected from the group consisting of nickel silver, cold-rolled steel, plated steel, and copper.

* * * * *